(12) United States Patent
Cheriton

(10) Patent No.: US 9,502,139 B1
(45) Date of Patent: Nov. 22, 2016

(54) FINE GRAINED ONLINE REMAPPING TO HANDLE MEMORY ERRORS

(71) Applicant: Intel Corporation, Santa Clara, CA (US)

(72) Inventor: David R. Cheriton, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 10 days.

(21) Appl. No.: 14/058,919

(22) Filed: Oct. 21, 2013

Related U.S. Application Data

(60) Provisional application No. 61/738,887, filed on Dec. 18, 2012.

(51) Int. Cl.
| | | |
|---|---|---|
| G11C 29/00 | (2006.01) | |
| G06F 11/10 | (2006.01) | |
| G06F 11/14 | (2006.01) | |
| G11C 29/52 | (2006.01) | |

(52) U.S. Cl.
CPC ........... *G11C 29/76* (2013.01); *G06F 11/1068* (2013.01); *G06F 11/1469* (2013.01); *G11C 29/52* (2013.01)

(58) Field of Classification Search
CPC .............................. G11C 29/808; G11C 29/76
See application file for complete search history.

(56) References Cited

U.S. PATENT DOCUMENTS

| | | | | |
|---|---|---|---|---|
| 4,426,688 | A * | 1/1984 | Moxley ................. | G11C 29/76 365/200 |
| 5,774,471 | A * | 6/1998 | Jiang ............................. | 714/711 |
| 7,093,171 | B2 * | 8/2006 | Hsu et al. ..................... | 714/711 |
| 7,415,644 | B2 * | 8/2008 | Bower et al. ................ | 714/724 |
| 7,802,152 | B2 * | 9/2010 | Brune et al. ................. | 714/710 |
| 8,255,742 | B2 * | 8/2012 | Ipek et al. ................... | 714/6.13 |
| 2011/0041005 | A1 * | 2/2011 | Selinger ........................... | 714/6 |
| 2015/0187442 | A1 * | 7/2015 | Sivasankaran ....... | G11C 29/765 365/185.09 |

* cited by examiner

*Primary Examiner* — Steve Nguyen
(74) *Attorney, Agent, or Firm* — Schwabe, Williamson & Wyatt, P.C

(57) ABSTRACT

An error in a physical memory realization at a physical memory address is detected. A first physical memory line corresponding to the physical memory address is determined. It is ensured that a duplicate of data content associated with the first physical memory line is associated with a second physical memory line. The physical memory address is remapped to use the second physical memory line for data content.

20 Claims, 8 Drawing Sheets

FIG. 3A

FINE GRAINED ONLINE REMAPPING TO HANDLE MEMORY ERRORS

CROSS REFERENCE TO OTHER APPLICATIONS

This application claims priority to U.S. Provisional Patent Application No. 61/738,887 entitled FINE-GRAINED ONLINE REMAPPING TO HANDLE MEMORY ERRORS filed Dec. 18, 2012 which is incorporated herein by reference for all purposes.

BACKGROUND OF THE INVENTION

The correct operation of a computer system usually presupposes that its physical memory performs correctly, such that each read at a physical memory address returns data content of precisely the same value that was last written to that memory address. Unfortunately, physical memory is subject to memory errors, such that this requirement is sometimes violated.

Physical memory errors come in at least two types. The first are transient errors that do not reflect a failing condition with the actual physical memory device, sometimes caused for example by cosmic rays or other transient conditions that "flip a bit". The second are permanent errors arising from device failures, for example "shorting" a memory to always be stuck to a specific value, regardless of the value was written to it. Physical memory errors should be handled efficiently to maintain correct operation of the computer system.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
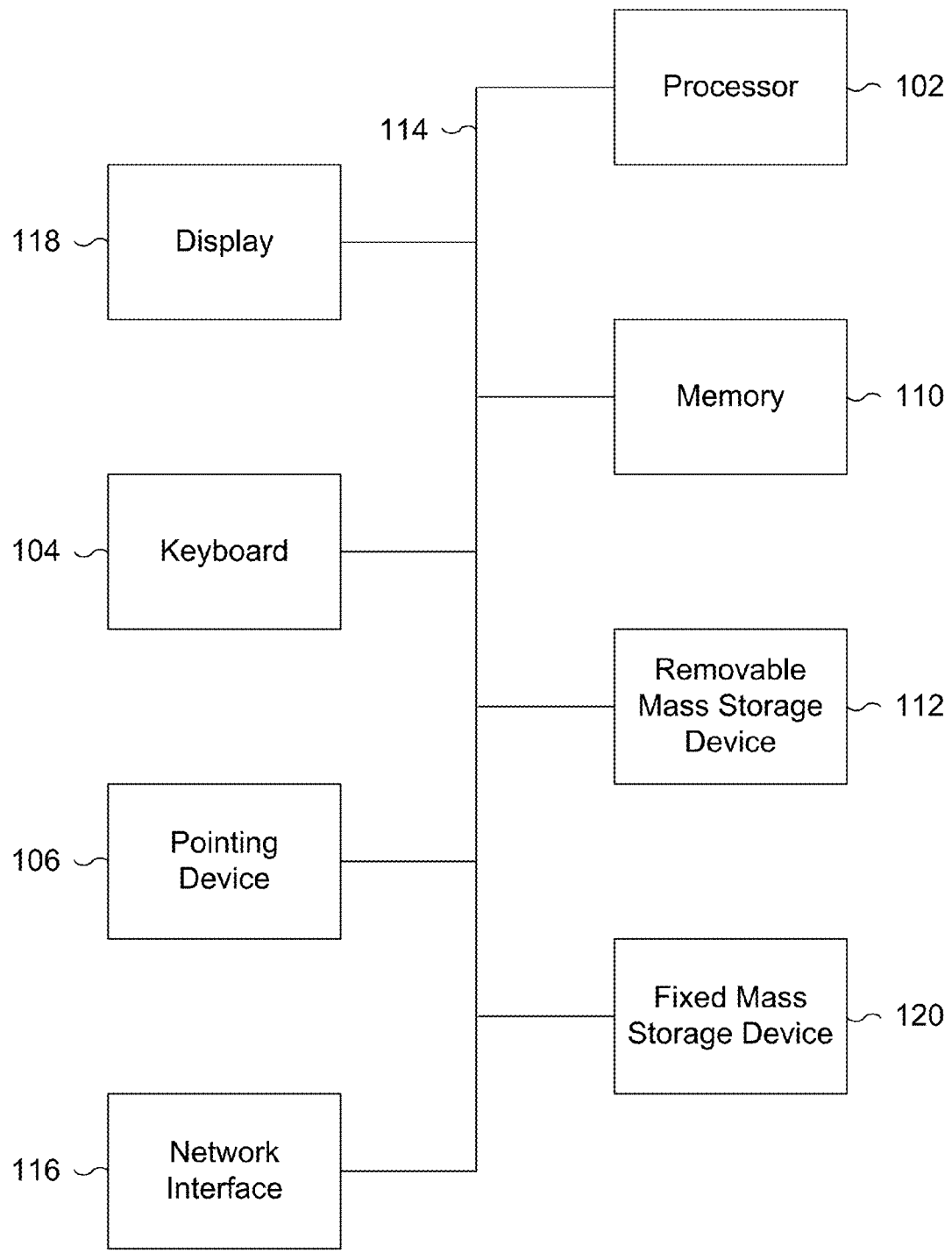
FIG. 1 is a functional diagram illustrating a programmed computer system for distributed workflows in accordance with some embodiments.

FIG. 1 is a functional diagram illustrating a programmed computer system for distributed workflows in accordance with some embodiments. As shown, FIG. 1 provides a functional diagram of a general purpose computer system programmed to execute workflows in accordance with some embodiments. As will be apparent, other computer system architectures and configurations can be used to execute workflows. Computer system 100, which includes various subsystems as described below, includes at least one microprocessor subsystem, also referred to as a processor or a central processing unit ("CPU") 102. For example, processor 102 can be implemented by a single-chip processor or by multiple cores and/or processors. In some embodiments, processor 102 is a general purpose digital processor that controls the operation of the computer system 100. Using instructions retrieved from memory 110, the processor 102 controls the reception and manipulation of input data, and the output and display of data on output devices, for example display 118.

Processor 102 is coupled bi-directionally with memory 110, which can include a first primary storage, typically a random-access memory ("RAM"), and a second primary storage area, typically a read-only memory ("ROM"). As is well known in the art, primary storage can be used as a general storage area and as scratch-pad memory, and can also be used to store input data and processed data. Primary storage can also store programming instructions and data, in the form of data objects and text objects, in addition to other data and instructions for processes operating on processor 102. Also as well known in the art, primary storage typically includes basic operating instructions, program code, data and objects used by the processor 102 to perform its functions, for example programmed instructions. For example, primary storage devices 110 can include any suitable computer-readable storage media, described below, depending on whether, for example, data access needs to be bi-directional or uni-directional. For example, processor 102 can also directly and very rapidly retrieve and store frequently needed data in a cache memory, not shown. The block processor 102 may also include a coprocessor (not shown) as a supplemental processing component to aid the processor and/or memory 110. As will be described below, the memory 110 may be coupled to the processor 102 via a memory controller (not shown) and/or a coprocessor (not shown), and the memory 110 may be a conventional memory, a structured memory, or a combination thereof.

A removable mass storage device 112 provides additional data storage capacity for the computer system 100, and is coupled either bi-directionally (read/write) or uni-directionally (read only) to processor 102. For example, storage 112 can also include computer-readable media such as magnetic tape, flash memory, PC-CARDS, portable mass storage devices, holographic storage devices, and other storage devices. A fixed mass storage 120 can also, for example, provide additional data storage capacity. The most common example of mass storage 120 is a hard disk drive. Mass storage 112, 120 generally store additional programming instructions, data, and the like that typically are not in active use by the processor 102. It will be appreciated that the information retained within mass storage 112, 120 can be incorporated, if needed, in standard fashion as part of primary storage 110, for example RAM, as virtual memory.

In addition to providing processor 102 access to storage subsystems, bus 114 can be used to provide access to other subsystems and devices as well. As shown, these can include a display monitor 118, a network interface 116, a keyboard 104, and a pointing device 106, as well as an auxiliary input/output device interface, a sound card, speakers, and other subsystems as needed. For example, the pointing device 106 can be a mouse, stylus, track ball, or tablet, and is useful for interacting with a graphical user interface.

The network interface 116 allows processor 102 to be coupled to another computer, computer network, or telecommunications network using a network connection as shown. For example, through the network interface 116, the processor 102 can receive information, for example data objects or program instructions, from another network, or output information to another network in the course of performing method/process steps. Information, often represented as a sequence of instructions to be executed on a processor, can be received from and outputted to another network. An interface card or similar device and appropriate software implemented by, for example executed/performed on, processor 102 can be used to connect the computer system 100 to an external network and transfer data according to standard protocols. For example, various process embodiments disclosed herein can be executed on processor 102, or can be performed across a network such as the Internet, intranet networks, or local area networks, in conjunction with a remote processor that shares a portion of the processing. Throughout this specification "network" refers to any interconnection between computer components including the Internet, Ethernet, intranet, local-area network ("LAN"), home-area network ("HAN"), serial connection, parallel connection, wide-area network ("WAN"), Fibre Channel, PCI/PCI-X, AGP, VLbus, PCI Express, Expresscard, Infiniband, ACCESS.bus, Wireless LAN, WiFi, HomePNA, Optical Fibre, G.hn, infrared network, satellite network, microwave network, cellular network, virtual private network ("VPN"), Universal Serial Bus ("USB"), FireWire, Serial ATA, 1-Wire, UNI/O, or any form of connecting homogenous, heterogeneous systems and/or groups of systems together. Additional mass storage devices, not shown, can also be connected to processor 102 through network interface 116.

An auxiliary I/O device interface, not shown, can be used in conjunction with computer system 100. The auxiliary I/O device interface can include general and customized interfaces that allow the processor 102 to send and, more typically, receive data from other devices such as microphones, touch-sensitive displays, transducer card readers, tape readers, voice or handwriting recognizers, biometrics readers, cameras, portable mass storage devices, and other computers.

In addition, various embodiments disclosed herein further relate to computer storage products with a computer readable medium that includes program code for performing various computer-implemented operations. The computer-readable medium is any data storage device that can store data which can thereafter be read by a computer system. Examples of computer-readable media include, but are not limited to, all the media mentioned above: magnetic media such as hard disks, floppy disks, and magnetic tape; optical media such as CD-ROM disks; magneto-optical media such as optical disks; and specially configured hardware devices such as application-specific integrated circuits ("ASIC"s), programmable logic devices ("PLD"s), and ROM and RAM devices. Examples of program code include both machine code, as produced, for example, by a compiler, or files containing higher level code, for example a script, that can be executed using an interpreter.

The computer system shown in FIG. 1 is but an example of a computer system suitable for use with the various embodiments disclosed herein. Other computer systems suitable for such use can include additional or fewer subsystems. In addition, bus 114 is illustrative of any interconnection scheme serving to link the subsystems. Other computer architectures having different configurations of subsystems can also be utilized.

Physical Memory Definition.

Throughout this specification a "physical memory realization", or physical memory and/or physical memory device, refers primarily to tangible primary memory of a computer system. In some embodiments, primary memory includes a semiconductor memory. In some embodiments, the semiconductor memory includes a volatile and/or non-volatile memory. Examples of physical memory include but are not limited to one or more of the following: RAM, dynamic RAM (DRAM), static RAM (SRAM), flash memory, programmable ROM (PROM/EPROM/EEPROM), non-volatile RAM (NVRAM), flash memory, NAND based memory, NOR based memory, and all forms of addressable semiconductor memory.

Error Detection Technology.

A computer physical memory system may be commonly designed with error detection and error correction codes (ECC) technology. In a typical realization, a code is able to correct a single bit errors and detect double bit errors, but not necessarily detect more errors, and not correct more than one single bit error per read access. Examples of ECC technology include SECDEC Hamming codes, Chipkill ECC and extended Hamming codes. Codes that allow detection and correction of more errors may impose more space and logic overhead on the memory system, and may not be so commonly used. With these error correction systems, a computer can continue normal operation when a single-bit error occurs in its memory system, but needs to restart when an uncorrectable, for example a multi-bit, error is detected during normal operation.

Memory Test Method.

One approach to dealing with memory errors is to run a memory test before normal system operation is initiated "offline" and then have software avoid using memory regions that are identified as bad, or to physically repair or replace the memory system before initiating normal operation. However, this approach does not deal with memory errors that arise during normal computer system operation when "online", as opposed to offline. A conventional memory tester is not feasible to execute during normal system operation because the memory test requires writing the memory to specific test patterns and reading it back, which would interfere with normal system operation.

A variant on a conventional memory tester is a tester that executes during normal system operation, often called a memory scrubber, that only runs tests on memory not allocated and/or not in use by application software. For example, an online memory tester running in an operating system can systematically unmap a specified physical page of memory from application use by copying the data to a second page and remapping applications using the specified page to use the second page. It then performs a memory test on the specified page and only allows continued use of the specified physical page if the memory page passes the memory test, otherwise sequestering it in a list of "bad pages" not used again. The memory scrubber approach incurs a significant overhead in time, power, and memory, and does not preclude an error occurring during application access to memory, which may cause application failure. Additionally, if a page is remapped because of a single-bit error, a significant amount of memory is rendered unusable for each such error.

Memory Error Mapping Inefficiency.

The cost of remapping an entire page for at least a single-bit error is further increased with the use of so-called "huge pages" of 2 megabytes or 4 megabytes of memory, a growing trend. In this case, a single bit error being detected may result in 8 million bits being rendered unused. Consequently, such page-level remapping and sequestering is normally only performed in the case of an uncorrectable error being detected, which means the application typically fails, or is rollbacked to an earlier checkpoint. In any case, memory may still be in active use by an application while experiencing a single-bit error, wherein the error is a clear indication of eventual failure of the physical memory device. One additional memory error, that is, an uncorrectable memory error results in failure and/or restart of an executing application or computer system occurs.

Figure 2A:
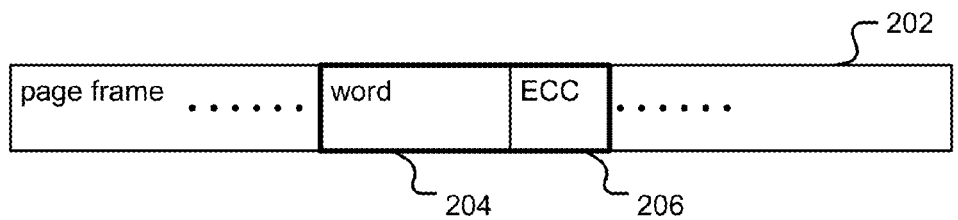
FIGS. 2A and 2B are illustrations of memory error mapping inefficiencies in the prior art.
Figure 2B:
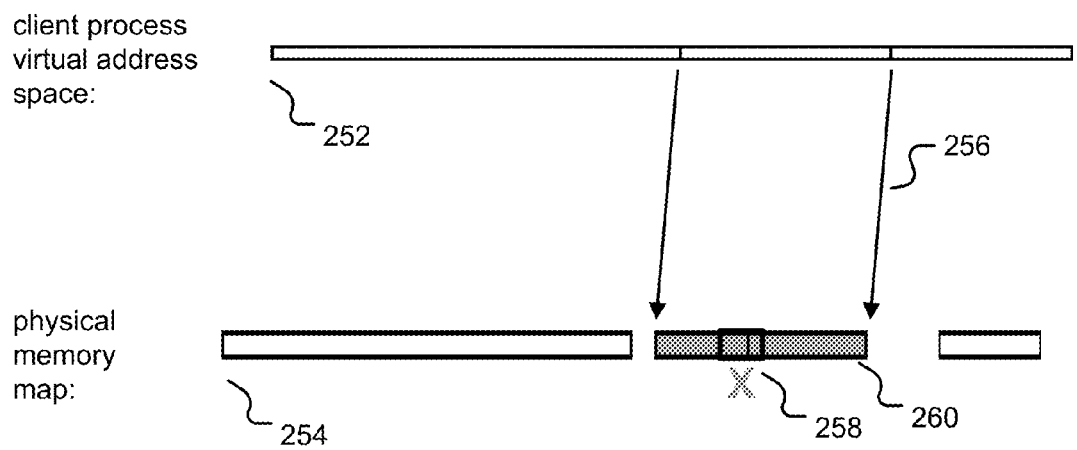

FIGS. 2A and 2B are illustrations of memory error mapping inefficiencies in the prior art. FIG. 2A is an example of a traditional page and/or page frame (202), which includes a plurality of memory words (204), each with parity memory reserved for ECC (206). FIG. 2B illustrates how a page (202) maps to a virtual address space in the client process (252). A page in virtual address space (252) is mapped (256) to a specific page frame (260) in the physical memory map (254). When an uncorrected error is detected in a single-bit in word (258) in the specific page (260), the entire page (260) may be rendered unused, shown as grey fill in FIG. 2B.

Greater Exposure to Memory Error.

The increased application memory requirements and reduced memory device costs are leading to significant increases in the memory capacity of computer systems, especially in data centers, where high availability is important. Increased memory capacity results in more frequent memory errors per systems. Many systems are now run 24 hours a day with no downtime, so memory errors during normal operation occur with greater probability. The time cost of restarting the system is also increased because of the increased time to reload the memory data, thereby reducing availability. The overhead of detection using software memory testing also increases significantly; alternately the latency between testing of the memory goes up because of reduced frequency of testing any given page, increasing the exposure to memory errors on application access.

Fine Grained Online Remapping of Physical Memory.

Fine grained online remapping of physical memory to handle physical memory errors is disclosed. This remapping reduces the frequency with which a memory error causes computer system failure.

Structured memory that structures memory with a specialized structured memory controller may perform fine grained online remapping of physical memory along with other properties. One example of a structured memory system/architecture is HICAMP (Hierarchical Immutable Content-Addressable Memory Processor) as described in U.S. Pat. No. 7,650,460 which is hereby incorporated by reference in its entirety. Such a special memory access path can provide other properties, as detailed in U.S. Pat. No. 7,650,460, such as sharing, deduplication, efficient snapshots, compression, sparse dataset access, and/or atomic update.

By extending rather than replacing the conventional memory, software can be reused without significant rewriting. In one embodiment, some of the benefits of a structured memory like HICAMP may be provided to a conventional processor/system by providing structured capabilities as a specialized coprocessor and providing regions of the physical address space with read/write access to structured memory by the conventional processors and associated operating system as disclosed in U.S. Pat. No. 8,407,428, which is hereby incorporated by reference in its entirety.

More generally and throughout this specification, a physical memory system is realized with a physical address translation mapping between physical addresses and the actual physical memory realization and/or device, with the unit of mapping being independent of the virtual memory page size.

Throughout this specification this unit of mapping is referred to as a "physical memory line", or line for brevity. When an error is detected in a physical memory device, this translation mapping is changed to map the associated address to a separate line with the same data content. By remapping the address, all the contiguous physical addresses that map to the same physical line are remapped. Throughout this specification a "line address" refers to a physical address that is mapped to a physical line, for example, that is used when the entire line contents is read as a single operation. Throughout this specification a "physical line ID" or PLID refers to the name of the identification of a unit of storage in the physical memory system that is capable of storing the contents of a physical line. Thus, a line address is mapped to a PLID, which identifies the content of the line. In one embodiment, one or more line addresses may be mapped to the same PLID.

In one embodiment, the mapping is performed by one or more "translation lines", which throughout this specification refers to a line which corresponds to a contiguous range of physical addresses, and contains a sequence of PLIDs, one for each line unit of content in this range of addresses. For example, a 64-byte translation line can contain 16 32-bit PLIDs, thereby representing a 1024-byte range of physical addresses, assuming a 64-byte data line as described in U.S. Pat. No. 8,407,428.

Figure 3A:
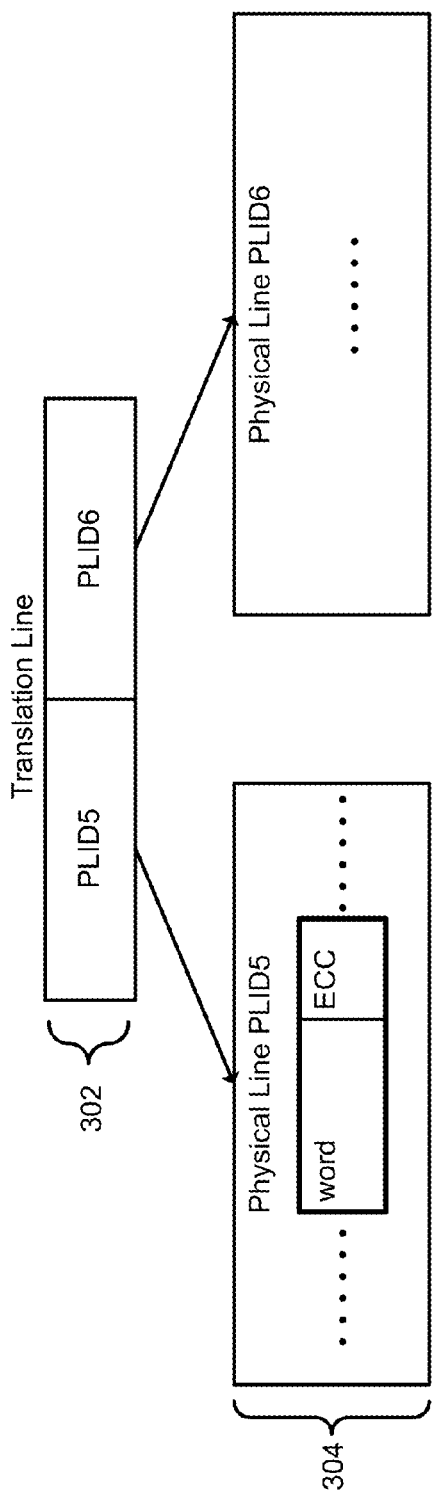
FIG. 3A is an illustration of a translation line and physical lines in a structured memory.

FIG. 3A is an illustration of a translation line and physical lines in a structured memory. In one embodiment, the structured memory (110) in FIG. 1 may include the structured memory in FIG. 3A. A translation line (302) contains a plurality of PLIDs, shown in FIG. 3A to contain two PLIDs, but may include a different number of PLIDs without loss of generality. One PLID in translation line (302) points to a physical line (304) with ID "PLID5". In one embodiment, the physical line (304) comprises 64-bytes, thus containing data content in the form of a plurality of words and their associated ECC.

Figure 3B:
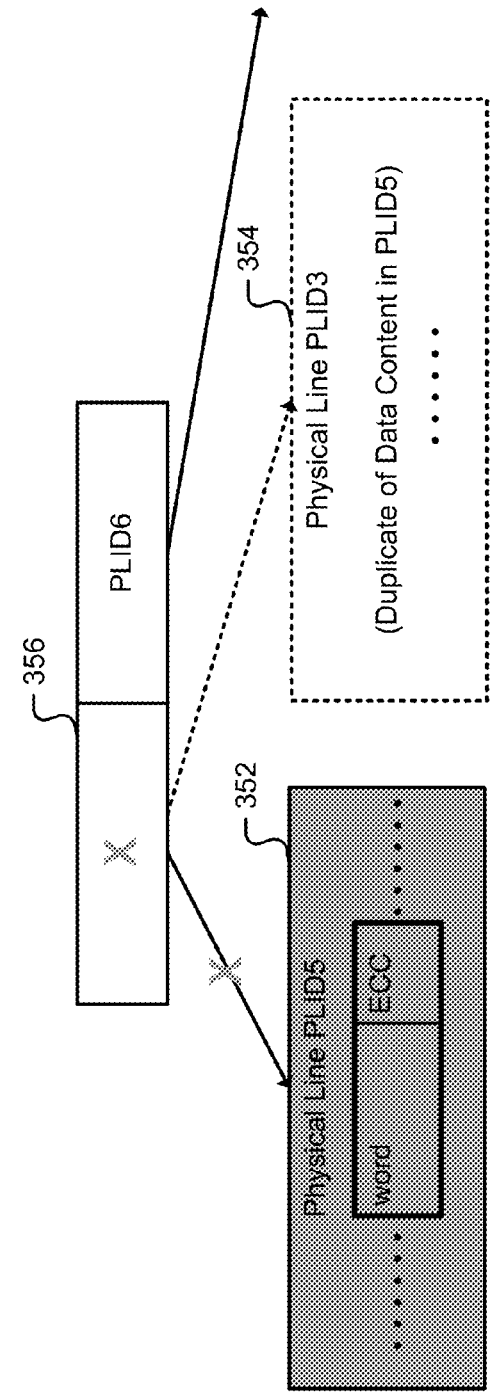
FIG. 3B is an illustration of fine grained online remapping to handle memory errors using a structured memory.

FIG. 3B is an illustration of fine grained online remapping to handle memory errors using a structured memory. In one embodiment, the structured memory (110) in FIG. 1 may include the structured memory in FIG. 3B. In one embodiment, the physical memory line (304, 352, 354) is equal to the cache line size. In operation, on a read to a memory address (denoted as XX), the ECC logic in a physical line "PLID5" (352) detects if there is an error in the cell of an associated memory device to which the address is mapped, wherein throughout this specification a "cell" may refer to any unit within a physical memory realization that an error may occur in. If no error is detected, the read completes immediately, returning the associated content. If a memory error is detected, shown in FIG. 3B as grey fill, the remapping logic is invoked and remaps memory address XX to a separate physical memory line "PLID3" (354) containing the same data content. The translation line (302) is then updated from PLID5 to PLID3 (356).

In one embodiment, the remapping unit allocates this separate memory line and initializes it with the data of the original memory line. In this case, if the error is correctable or transient, the remapping logic copies the contents of the original memory line to the separate memory line. If the content cannot be extracted from the original memory line, the remapping logic either retrieves the data from an auxiliary location or else signals to software to handle the situation.

In one embodiment, the remapping is performed concurrently or after the data has been returned to the read-requesting processor. In one embodiment, the auxiliary location may be one containing the same line contents present in the cache of a separate core and/or separate processor.

In one embodiment, the contents of memory lines are stored to a secondary or backup memory location such as flash memory. In this case, the system may be able to recover from an uncorrectable memory error by copying the corresponding memory content from the corresponding backup memory location.

In some embodiments, for correct operation, it may be required that this backup memory location contain the same data as that originally stored in the failed memory line. In one embodiment, the secondary memory is designated as containing a checkpoint of an earlier state of the system, and the system is then rolled back to this checkpoint as part of recovering from this memory error. In one embodiment, it intended that the checkpoint includes the same data as originally stored in the failed memory line.

In one embodiment with a secondary copy of memory, a line is copied to the secondary memory when a single-bit error is detected, ensuring there is a copy to use in recovery if the errors in the associated device lead to a multi-bit and/or unrecoverable error in a subsequent access. In this case, the memory line is only remapped on an unrecoverable memory error. A line that is so duplicated to secondary memory may be flagged such that subsequent writes are also reflected to the corresponding location in secondary memory.

Figure 3C:
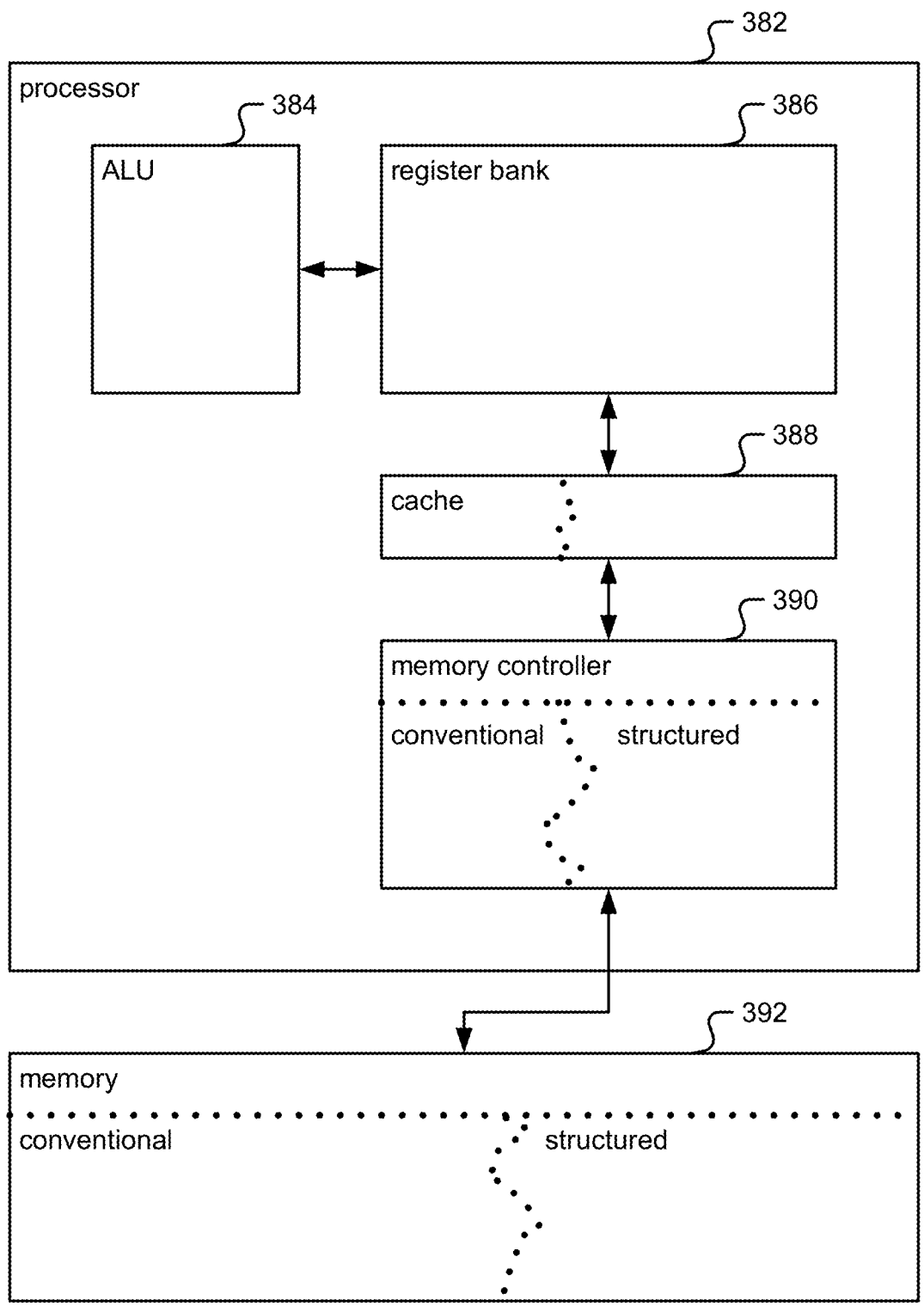
FIG. 3C is a block diagram illustrating logical view of an embodiment of an architecture to use structured memory properties.

FIG. 3C is a block diagram illustrating logical view of an embodiment of an architecture to use structured memory properties. A processor 382 is coupled with a memory 392. Memory 394 comprises a memory dedicated to conventional (for example, flat addressed) memory, and a memory dedicated to structured (for example, HICAMP) memory. A zig-zag line on FIG. 3 (394) indicates that the conventional and structured memory may be clearly separated, interleaved, interspersed, statically or be dynamically partitioned at compile-time, run-time or any time. The processor 382 comprises an ALU 384, a register bank 386, a cache 388, and a memory controller 390. In some embodiments the memory controller is external to processor 382. Similar to memory 392, cache 388 and memory controller 390 may accommodate or be partitioned between conventional memory and/or structured memory. In some embodiments there may be two or more caches 388, memory controllers 390, and physical memory 392 representing a combination dedicated to conventional and structured memory.

Figure 4:
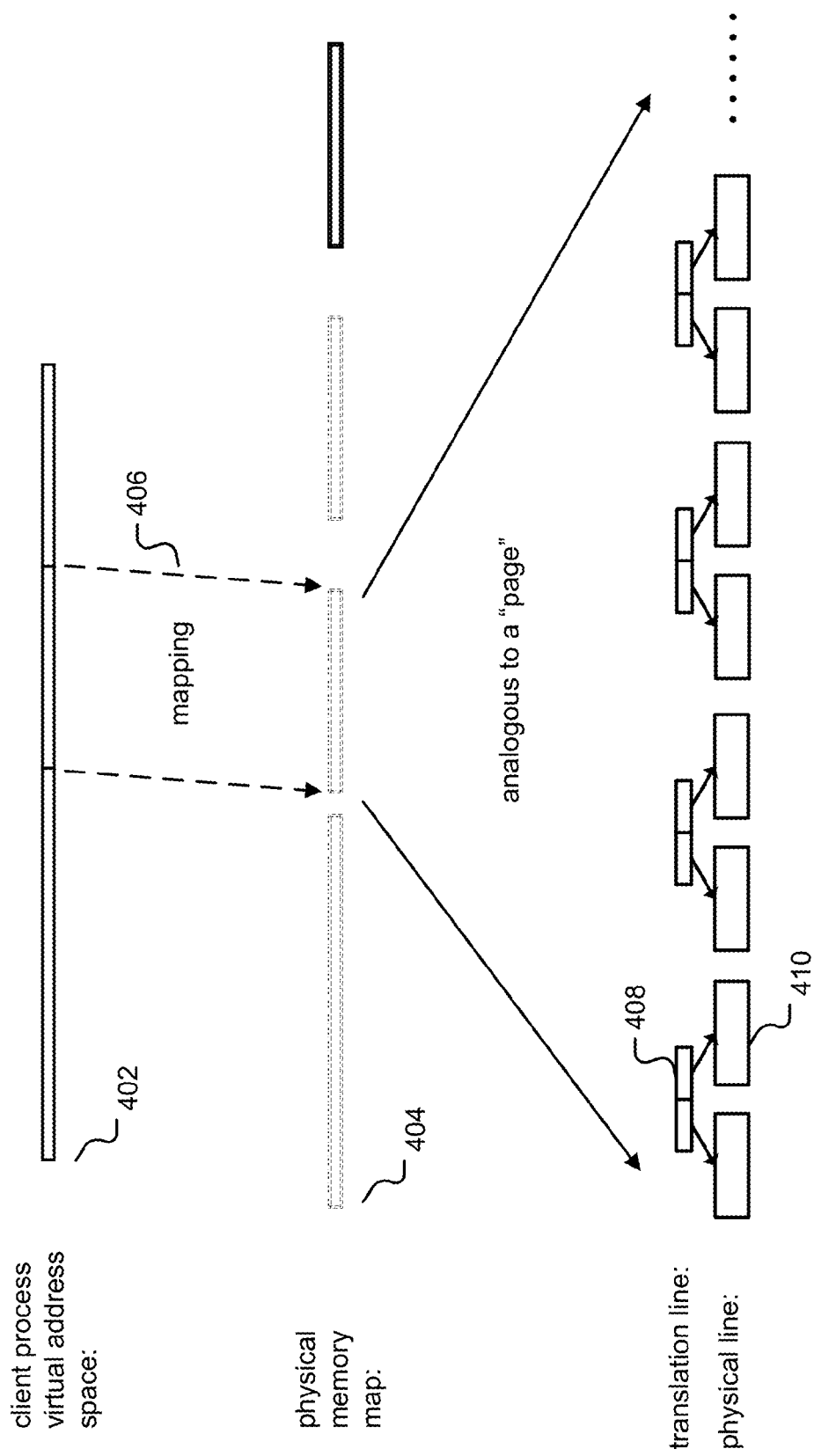
FIG. 4 is an illustration of structured memory mapping.

FIG. 4 is an illustration of structured memory mapping. The illustration in FIG. 4 may be compared to that of FIG. 2 in traditional virtual memory paging. The client process virtual address space 402 maps to a physical memory map (404) which may include both conventional memory and structured memory, as described in U.S. Pat. No. 8,407,428. In the mapping (406) of a particular address, it is determined that the particular address will map to structured memory and the analogy of a page is the collection of translation lines (408) and physical lines (410).

Shared Physical Lines.

In one embodiment, the memory lines are shared. That is, multiple independent physical line addresses can be translated to the same PLID. That is, the same PLID is referenced by two or more translation lines. In this case, the remapping logic may only remap one of the several mappings to this memory unit on a memory error, namely the one being used in the current operation. This is because in such an embodiment there is no reverse mapping from a PLID to translation lines that reference it, so there is no efficient way to locate these other references.

In one embodiment, in the case of a read and memory error to a shared line, as part of remapping this currently accessing translation entry to a separate line and new PLID, state associated with the original PLID is updated to indicate the new PLID containing this content. Thus, a subsequent access to the original PLID can be redirected to the new PLID, analogous to a "forwarding address". This subsequent access operation can further update its associated translation state to reference the new PLID so the overhead of redirection is only incurred on the first such reference after the remapping.

In one embodiment, the line itself contains multiple separately ECC'ed cells. It is very unlikely that all are suffering memory errors. Thus, one of these cells can be used to store the redirect information and/or forwarding address. Specifically, it can be written with the PLID of the separate line to which the earlier access was remapped.

Figure 5:
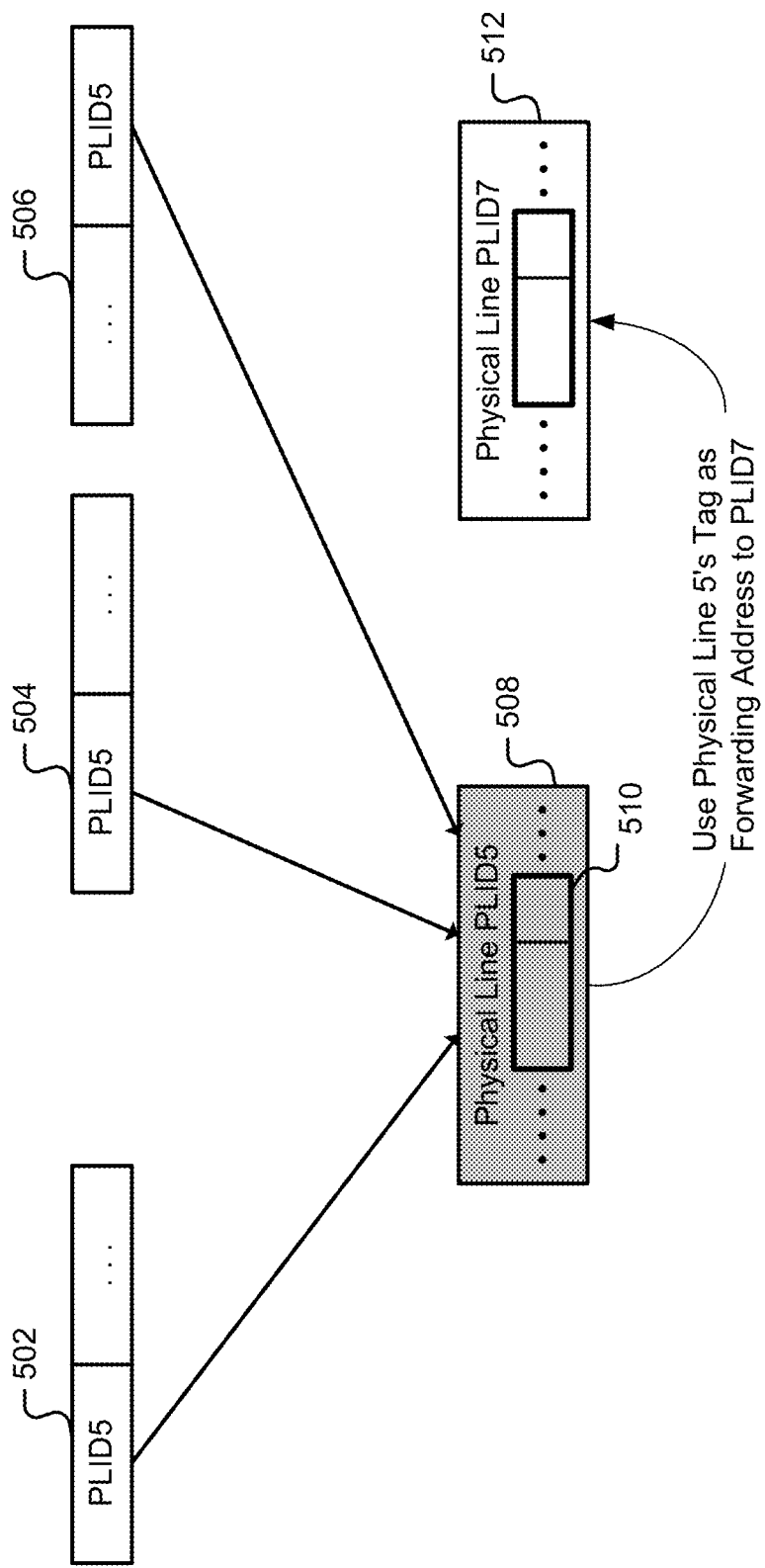
FIG. 5 is an illustration of a forwarding address for fine grained online remapping for physical lines.

FIG. 5 is an illustration of a forwarding address for fine grained online remapping for physical lines. In this example, a plurality of translation lines (502, 504, 506) reference the same physical line, PLID5 (508). When a memory error occurs within a portion of PLID5, it is determined that at least some the remaining data or metadata of PLID5 may safely store a forwarding address. In the example shown in FIG. 5, PLID5's tag field (510) is safe. The data content is copied to PLID7 (512). One example of hardware metadata tags are HICAMP tags as described in U.S. patent application Ser. No. 13/712,878 entitled "HARDWARE-SUPPORTED PER-PROCESS METADATA TAGS" which is hereby incorporated by reference in its entirety. In one embodiment, a PLID may include one or more tag fields. PLID5's metadata tag is thus used as a forwarding address to PLID7, as shown in FIG. 5.

In one embodiment, such as HICAMP or a structured memory coprocessor as described in U.S. Pat. No. 8,407,428, there is a reference count associated with shared lines to indicate when a PLID can be deallocated, for example when the reference count goes to zero. When the physical memory cells corresponding to a PLID are determined to be having errors as above, the reference count from the original PLID is copied to the reference count of the new PLID. Further, the reference count storage associated with the PLID can be repurposed to store the remap or redirection information.

In this example, this erroneous PLID is never reallocated so this redirection persists indefinitely. Thus, a subsequent access by a reference to the original PLID will always have this redirection information, since this redirection information would not be deleted, overwritten or repurposed for other than this redirection.

In one embodiment, a "backmap" is provided that identifies, for each PLID, the translation lines, possibly offset with the translation line, that refers this PLID. In such an embodiment, all the locations referencing a given PLID can be remapped when a memory error is detected, not just the translation line used as part of the reference to detect this error.

Deduplicated Physical Lines.

In one embodiment, the physical lines are deduplicated, wherein deduplication refers to the general process of eliminating redundant or duplicate information. The overhead of writing physical lines to a secondary memory is reduced because a line only needs to be written back when it is a newly allocated line, for example content that is not already present in the memory. To permit content lookup for the deduplication mechanism a hashtable is used comprising hash buckets.

Figure 6:
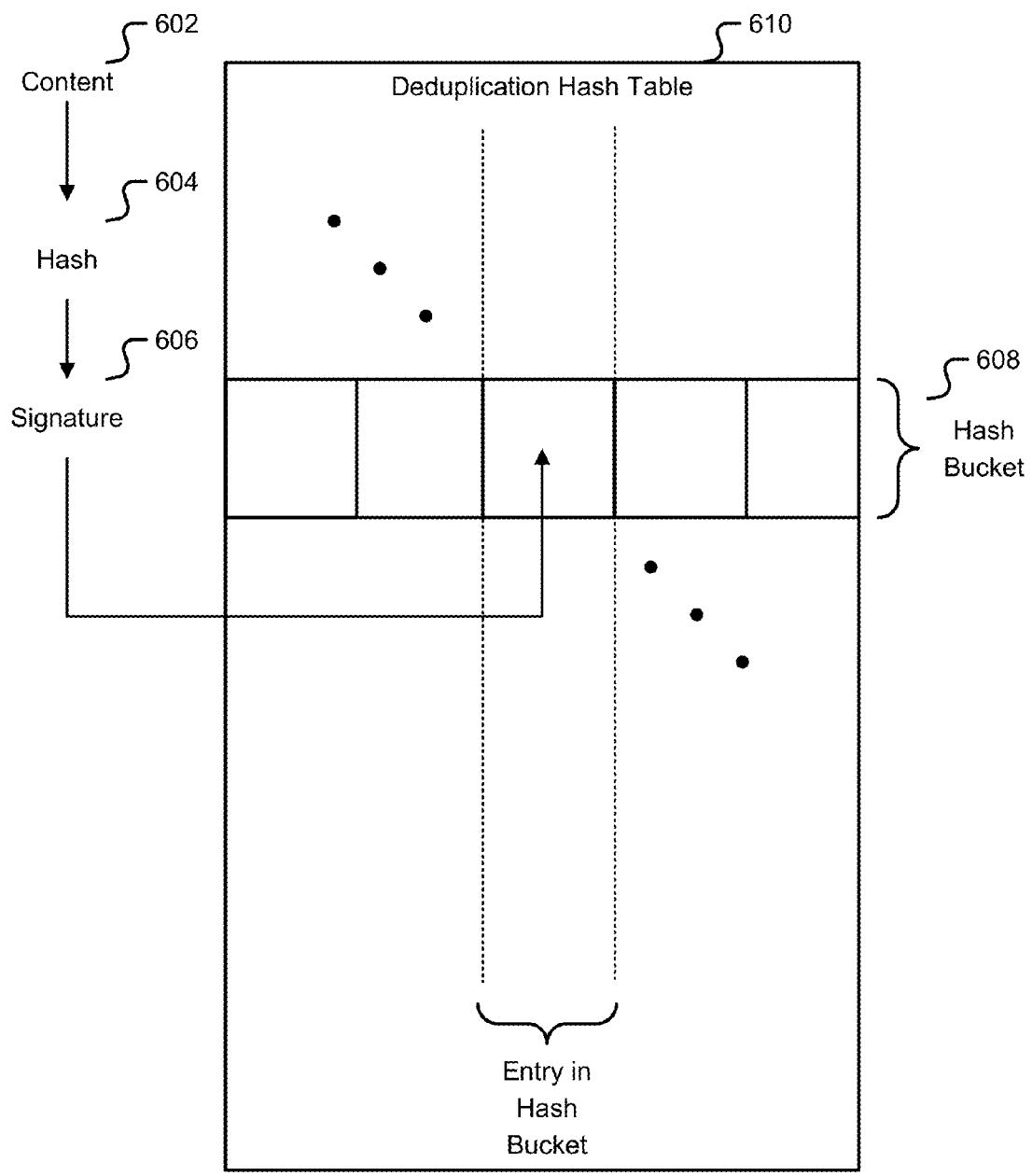
FIG. 6 is an example illustration of content lookup using a hash table.

FIG. 6 is an example illustration of content lookup using a hash table. In one embodiment, content for a physical line (602) to be written is hashed (604). The resulting hash value is used to index a hash bucket (608) within the hash table. Each hash bucket reserves a line for use as a signature (606) line. The signature line contains a field for each remaining line in the bucket, each containing a hash of the line stored in the corresponding line, or zero if the line is free. The signature line can thus quickly indicate if there is a potential match in the bucket, and if not, an available line into which to write the new content. In the case of a memory line exhibiting errors, the corresponding signature line entry can be used to store error and redirection information.

As an optimization in some cases, the separate line to which the translation line is remapped on a memory error can be located in the same hash bucket so that subsequent accesses can locate this line by content, for example a write by the same content. For example, if the signature line for the bucket containing the original line L1, which is now exhibiting a memory error, indicates that line L2 in the same bucket is free, the contents of line L1 can be written to line L2, the corresponding signature entry updated to indicate this content is present, and the original signature line entry corresponding to line L1 updated with redirection information. If the hash bucket is completely occupied, the separate line can be located in an overflow area, either sacrificing this benefit, or requiring the redirection from original hash bucket on lookup by content.

In one embodiment using so-called d-left, or 2-choice, hashing, there are effectively two buckets in which a given content can be stored and still be locatable by a lookup by content. In such an embodiment, when a PLID is determined to map to a memory device experiencing errors, the associated line content can be relocated to the other hash bucket, if the other hash bucket has space.

In one embodiment using deduplication, a hash computation on the content of a line is used to determine the bucket in which to place the line. In one embodiment of this nature, the memory access logic can recompute this hash on reading the line and use the resulting hash value as an indication of a memory error if this value does not match the current hash bucket.

In one embodiment, the mismatch of the resulting hash value as above can be used to indicate that a line has been remapped, invoking the remapping logic to determine the new location of the line contents.

Remapping of Single-Bit Errors.

There is a trade-off between remapping on any single-bit, and thus correctable, error and deferring the remapping until multiple errors. Doing an immediate remapping on any single-bit error reduces the probability of a subsequent memory device failure leading to an uncorrectable error. Some DRAM error studies indicate that single-bit errors are correlated with subsequent more serious failures of the associated memory devices. However, doing so results in memory lines being wasted if they have been only transiently affected by, for example, a cosmic particle. Fine-grain remapping significantly reduces the penalty of such "aggressive" remapping. Various approaches are available to further optimize this trade-off.

In one embodiment, the remapping logic, on a single-bit error, attempts to write and then reread the data to determine if the read fails again. The remapping only takes place if the second read also has an error.

In one embodiment, a record of prior single-bit errors, including their location, is maintained. On a memory error, the remapping logic reads the record, if any, and decides on whether to remap based on the prior history of errors at this location or in the associated memory device.

In one embodiment, a copy of the line contents is maintained in a secondary storage such as flash memory. In this case, the remapping logic can refine the trade-off based on being able to retrieve the content from this secondary storage if there is later an uncorrectable error. In this case, there is a performance trade-off because recovery from secondary storage makes the subsequent access significantly more expensive in elapsed time than access to memory through the normal path.

Errors in Translation Memory.

In some embodiments, the translation memory is a small portion of the total physical memory capacity so the probability of a memory error in this region is significantly smaller than that in the memory devices storing the data. In some applications, this reduced probability is sufficient, recognizing that there is some probability of system failure in any case, including from other sources other than the memory system. Nevertheless, memory errors in translation memory can occur.

In one embodiment, translation memory can be saved to secondary storage along with the data memory contents. For instance, the system periodically checkpoints the translation memory to this secondary storage. The information checkpointed can include any or all of the values in the translation memory. Then, on an unrecoverable error in a translation memory, the system rolls back to this checkpoint and resume from that point.

The overhead and bandwidth required to checkpoint is reduced by being able to save the line contents separately from the translation memory, incrementally and based on modification since the last save to secondary storage. This is particularly true in an embodiment in which the lines are shared and further if the lines are deduplicated.

The overhead of checkpointing translation lines can be further reduced by tracking which translation lines have been modified since the last checkpoint, and only writing out those translation lines that have been modified. In one embodiment in which a translation line corresponds to a memory page as defined by the virtual memory mapping, this virtual memory map may provide the "dirty" indication on the corresponding translation line, wherein "dirty" relates to indicating the line has been modified or changed since an earlier time and thus need some additional processing to accommodate these changes.

As another technique to deal with translation memory errors, in one embodiment, the operating system is notified when a memory error is detected in a translation line. In response, the operating system can revise the virtual memory mapping to remap addresses that previously mapped to the original translation line area to map to a separate translation line area, for example as shown in FIG. 4 (406). This separate translation line area is initialized in advance of this remapping to contain the same sequence of PLIDs and the original translation line, thereby having it present the same content as the original. Here, a virtual memory page size may correspond to one or several translation lines. As part of the page-level remapping, each translation line in the page is copied.

In one embodiment with shared lines, the required copy is less expensive because only the PLIDs are copied, not the actual data. Moreover, compared to a conventional copy-on-write by the operating system at a page level to deal with memory errors, only the translation lines corresponding to the page are sacrificed because of the memory error, not memory capacity equal to the size of the page. The translation line is significantly smaller than a page and the original data lines can still be used by the copied translation line, so cost for dealing with memory errors is significantly lower with this application than in a conventional memory system.

Errors in Reference Count Memory.

On detecting an unrecoverable memory error in a cell of memory storing reference counts, the reference count can be treated as some maximum value, so the associated cell is never deallocated. If the actual number of references to this cell goes to zero, the memory capacity of this line is effectively lost to the system, the same as if the line was sequestered as a result of the memory error. However, this approach allows the continued use of the data line until these current references are removed.

In one embodiment storing redirect information in the reference count memory, this redirect information can be stored in a secondary location, allowing it to be recovered in the case of unrecoverable reference count memory error. This secondary location can be in flash memory or a separate region of DRAM. Because this redirect information is only used for lines that were shared at the time that the error remapping took place, the number of such redirections is expected to be small.

In one embodiment, given the low probability of a memory error in a cell of reference count memory that actually affects system operation, the system takes no action on a correctable memory error in reference count memory and proceeds as above in the case of an uncorrectable memory error.

There are numerous other techniques in the art that provide higher reliability of data at a commensurate increase in cost and overhead. These can be applied to reference count memory. For example, a stronger form of ECC per reference count could be used. The overhead is reduced by the fact that the memory containing the reference counts is a small portion of the overall memory.

Memory Scrubbing.

In one embodiment, a memory scrubbing functionality is provided that reads memory concurrently with application execution. The process can ensure that memory is read periodically within a given period of time, thus allowing errors to be detected sooner.

In one embodiment, this mechanism of memory scrubbing is implemented as a hardware state machine that is part of the memory controller or cache controller. It may use the unused memory cycles to access physical memory, avoiding any direct or indirect negative impact on application execution.

The memory scrubbing functionality can take any of the actions as described in response to detecting a memory error, including remapping the memory, reloading the contents from a secondary memory if necessary, and updating memory error records.

More Sophisticated ECC.

In one embodiment, a more sophisticated ECC means is used to correct K-bit errors for K greater than 1, rather than just single-bit error. In this embodiment, the remapping logic can be specified to only remap on L errors, where L is less than or equal to K. In effect, the additional memory capacity overhead for the sophisticated ECC can reduce the overhead of remapping, for example wastage because of failed memory devices. Remapping is still useful because memory device failures can exceed the protection provided by the sophisticated ECC.

In another embodiment relying on a secondary memory backup, the memory system can simply implement error detection, relying on the secondary memory to recover the data, while using the fine-grain remapping of the described techniques to remap to a separate line that is initialized with this recovered data.

Benefits of Fine Grained Online Remapping to Handle Memory Errors.

The fine-grain remapping of memory in response to memory errors reduces the likelihood of unrecoverable memory errors during system execution while minimizing the memory space overhead of sequestering regions of memory on non-fatal memory errors, such as single-bit errors in a system using conventional ECC. It thereby provides substantially higher availability at a low cost compared to prior art.

The hardware realization of remapping at the physical address level allows this remapping to take place transparent to software, minimizing the overhead on software and providing more predictable system response even in the presence of memory errors. It also allows fine-grain remapping at the line level, a granularity which is not normally exposed to software.

It also facilitates coupling the remapping criteria and actions to the specific realization of physical memory. For example, the hardware can easily treat differently a memory error in a data line or a translation line or reference count memory with approaches optimized for each case.

Furthermore, with the increased tolerance of memory errors as a result of using the techniques described, a computer system in the expected case should be able to continue in operation until the system itself is obsolete and thus can be replaced rather than repaired. In this sense, it effectively eliminates the need for maintenance of computer memory systems by merging this maintenance with the normal upgrade cycles used in computer systems, at least in demanding data center environments.

Figure 7:
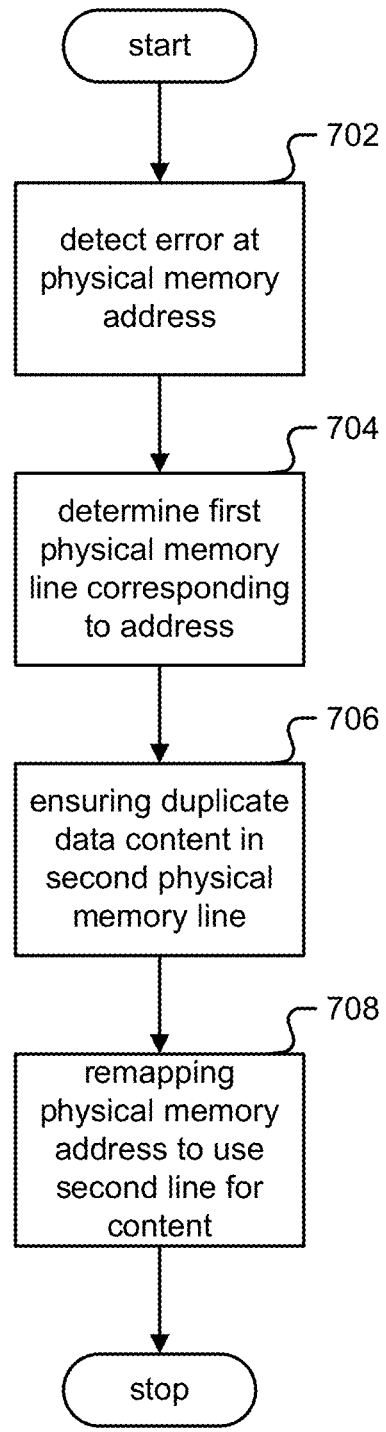
FIG. 7 is a flow chart illustrating an embodiment of a process for fine grained online remapping.

FIG. 7 is a flow chart illustrating an embodiment of a process for fine grained online remapping. In step 702, an error is detected at a physical memory address, for example at physical memory address 0x4567. In step 704, a first physical memory line, for example the physical line with PLID "PLID17", corresponding to the address (0x4567) is determined. In step 706, it is ensured that the data content associated with a second physical memory line, for example a physical line with PLID "PLID3", is a duplicate of the data content associated with the first physical memory line (PLID17). In step 708, the physical memory address (0x4567) is remapped to use the second physical memory line (PLID3) for data content.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An apparatus, comprising:
    a physical memory realization having a plurality of physical memory lines and a plurality of translation lines, wherein each translation line has a plurality of pointers respectively associated with a line address and selectively pointing to a plurality of the physical memory lines, wherein a memory arrangement is to:
    receive a request for a data operation for a data item in a first physical memory line of the physical memory lines of the physical memory realization at a physical memory address;
    detect an error in the physical memory realization at the physical memory address, based at least in part on the data operation;
    ensure a duplicate of the data item associated with the first physical memory line is associated with a second physical memory line; and
    update a pointer to remap the physical memory address to be associated with the second physical memory line for subsequent data operations for the data item.

2. The apparatus of claim 1, further comprises a general-purpose processor to make the request for the data-operation, and wherein the physical memory realization comprises a memory scrubber separate and independent of the general-purpose processor to detect a memory error.

3. The apparatus of claim 1, wherein each physical memory line comprises a plurality of memory words, and wherein the data item is one of the plurality of memory words.

4. The apparatus of claim 1, wherein to update the pointer comprises to update a first of the plurality pointers of the translation line previously pointing to the first physical memory line to point to the second physical memory line.

5. The apparatus of claim 1, wherein to ensure a duplicate of the data item associated with the first physical memory line is associated with a second physical memory line comprises to copy the data item associated with the first physical memory line to the second physical memory line.

6. The apparatus of claim 5, wherein to copy the data item associated with the first physical memory line to the second physical memory line comprises to copy the data item to a secondary backup memory location.

7. The apparatus of claim 6, wherein to copy the data item to a secondary backup memory location comprises to copy the data item to a flash memory.

8. The apparatus of claim 1, wherein each physical memory line corresponds to a cache line.

9. The apparatus of claim 1, wherein each physical memory line is sharable.

10. The apparatus of claim 9, wherein the memory arrangement is further arranged to update a tag associated with the first physical memory line with a forwarding address to redirect to the second physical memory line.

11. The apparatus of claim 10, wherein the forwarding address is implemented as a hardware tag.

12. The apparatus of claim 1, wherein the physical memory realization is to further de-duplicate duplications of the physical memory lines.

13. The apparatus of claim 12, wherein to de-duplicate comprises to perform d-left hashing.

14. The apparatus of claim 1, wherein to update is performed in response to correctable memory errors.

15. The apparatus of claim 1, wherein the physical memory realization comprises a structured memory controller, wherein the structured memory controller is to cause a hardware metadata tag to be realized for a physical memory line.

16. The apparatus of claim 1, wherein the physical memory realization is to further check point the translation line associated with the first physical memory line.

17. The apparatus of claim 1, wherein the physical memory realization comprises a reference count memory associated with each physical memory line, and wherein the physical memory realization is to further store redirect information in the reference count memory associated with each physical memory line.

18. A method, comprising:
    receiving a request for a data operation for a data item in a first physical memory line of a plurality of physical memory lines of a physical memory realization at a physical memory address;
    detecting an error in the physical memory realization at the physical memory address, based at least in part on the data operation;
    ensuring a duplicate of the data item associated with the first physical memory line is associated with a second physical memory line; and
    updating a pointer in a translation line of a plurality of translation lines, each translation line having a plurality of pointers respectively associated with a line address and selectively pointing to a plurality of the physical memory lines to remap the physical memory address to be associated with the second physical memory line for subsequent data operations for the data item.

19. The method of claim 18, wherein updating a pointer in a translation line comprises updating a first of the plurality pointers of the translation line previously pointing to the first physical memory line to point to the second physical memory line.

20. The method of claim 19, further comprising updating a tag associated with the first physical memory line with a forwarding address to redirect to the second physical memory line.

* * * * *

UNITED STATES PATENT AND TRADEMARK OFFICE
CERTIFICATE OF CORRECTION

| | | |
|---|---|---|
| PATENT NO. | : 9,502,139 B1 | Page 1 of 1 |
| APPLICATION NO. | : 14/058919 | |
| DATED | : November 22, 2016 | |
| INVENTOR(S) | : David R. Cheriton | |

It is certified that error appears in the above-identified patent and that said Letters Patent is hereby corrected as shown below:

In the Claims

Claim 2, Column 13:
Line 50 reads, "comprises," and should read --comprising--

Claim 19, Column 14:
Lines 59-60 reads, "plurality pointers," and should read --plurality of pointers--

Signed and Sealed this
Tenth Day of October, 2017

Joseph Matal
*Performing the Functions and Duties of the*
*Under Secretary of Commerce for Intellectual Property and*
*Director of the United States Patent and Trademark Office*